United States Patent [19]

Shoda et al.

[11] Patent Number: 5,209,180
[45] Date of Patent: May 11, 1993

[54] SPIN COATING APPARATUS WITH AN UPPER SPIN PLATE CLEANING NOZZLE

[75] Inventors: Mikio Shoda; Masaaki Yamamoto, both of Kyoto, Japan

[73] Assignee: Dainippon Screen Mfg. Co., Ltd., Kyoto, Japan

[21] Appl. No.: 852,048

[22] Filed: Mar. 16, 1992

[30] Foreign Application Priority Data

Mar. 28, 1991 [JP] Japan ................................ 3-91264

[51] Int. Cl.⁵ ............................................. B05C 11/08
[52] U.S. Cl. ........................................ 118/52; 118/56; 118/70; 118/302; 118/320; 134/153; 134/902
[58] Field of Search ................ 118/52, 56, 70, 302, 118/321, 320; 134/104.1, 153, 902

[56] References Cited

U.S. PATENT DOCUMENTS

| | | | |
|---|---|---|---|
| 4,075,974 | 2/1978 | Plows et al. | 118/52 |
| 4,790,262 | 12/1988 | Nakayama et al. | 134/153 |
| 4,838,979 | 6/1989 | Nishida et al. | 134/902 |
| 4,889,069 | 12/1989 | Kawakami | 118/52 |
| 5,013,586 | 5/1991 | Cavazza | 118/52 |
| 5,020,200 | 6/1991 | Mimasaka et al. | 118/321 |
| 5,069,156 | 12/1991 | Suzuki | 118/52 |

FOREIGN PATENT DOCUMENTS

| | | | |
|---|---|---|---|
| 54-12670 | 1/1979 | Japan | 118/52 |
| 54-98574 | 8/1979 | Japan | 118/52 |
| 59-87069 | 5/1984 | Japan. | |
| 2-219213 | 8/1990 | Japan. | |

*Primary Examiner*—W. Gary Jones
*Assistant Examiner*—Todd J. Burns
*Attorney, Agent, or Firm*—Lowe, Price, Leblanc & Becker

[57] ABSTRACT

A spin coating apparatus for use in applying a coating solution in film form to an upper surface of a substrate. This apparatus includes a spinning table for supporting and spinning the substrate in horizontal posture, an upper spinning plate disposed parallel to and substantially slightly spaced from the upper surface of the substrate supported on the spinning table, and having an opening formed substantially centrally thereof, the upper spinning plate being adapted to spin concurrently with the spinning table, and a cleaning nozzle vertically movably mounted in the opening of the upper spinning plate. The cleaning nozzle is lowered when cleaning a lower surface of the upper spinning plate, so that a cleaning liquid outlet port formed in a lower end region of the cleaning nozzle is exposed below the lower surface of the rotary plate. In this state, a cleaning liquid is directed to the lower surface of the upper spinning plate being spinng to clean the lower surface thereof.

7 Claims, 4 Drawing Sheets

SPIN COATING APPARATUS WITH AN UPPER SPIN PLATE CLEANING NOZZLE

BACKGROUND OF THE INVENTION (1) Field of the Invention

The present invention relates to spin coating apparatus for use in applying a photoresist or other coating solution in film form to surfaces of substrates such as glass substrates for liquid crystal displays, semiconductor wafers, or mask substrates for manufacturing semiconductor devices.

(2) Description of the Related Art

The spin coating apparatus applies a coating solution to a spinning substrate, and the solution is spread over the substrate by the centrifugal force. In the case of using the apparatus for a square substrate, the formed film tends to be thicker in the corners than in other parts of the substrate.

This is because the corners of a square substrate in a spin cut through ambient air or gas, and are exposed to the air more than other parts of the substrate. As a result, evaporation of the solvent of the coating solution is promoted in the corners to increase viscosity of the solution and diminish the spreading effect of the centrifugal force. In the case of a round substrate, the larger the substrate is, the greater is the difference in peripheral speed between a radially outward position and a radially inward position of the substrate. Thus, the tendency to increase the film thickness in peripheral regions is not negligible.

A spin coating apparatus devised to solve the problem encountered with square or large substrates is disclosed in Japanese Patent Publication Kokai (Unexamined) No. 1990-219213. This apparatus includes at least a chuck for holding a substrate and a spinning device for spinning the chuck. The substrate is spun in a horizontal plane as held by the chuck, whereby a coating solution once applied to the substrate is spread over an upper surface of the substrate. This known apparatus further includes an upper spinning plate having a larger diameter than the substrate. The spinning plate is disposed parallel to and slightly spaced from the upper surface of the substrate supported on the chuck. The substrate and spinning plate are spun together.

In the above prior construction, a layer of air over the upper surface of the substrate spins with the substrate and spinning plate as sandwiched therebetween. With the air little disturbed in peripheral regions of the substrate, the coating solution is applied in a uniform film thickness.

However, the conventional apparatus noted above has the following new disadvantages:

The upper spinning plate must be disposed as close to the substrate as possible in order to cooperate with the substrate to spin the layer of air over the substrate. Consequently, mist of the coating solution scattering upward from the substrate in the spin coating treatment adheres to and hardens on the lower surface of the upper spinning plate. In the course of repeated spin coating treatments, the lower surface of the spinning plate becomes rugged with the coating solution adhering thereto. It has been found that the rugged surface causes those disturbances of the layer of air over the substrate which will be detrimental to uniform film formation. Further, in a subsequent spin coating treatment carried out before hardening of the coating solution adhering to the lower surface of the upper spinning plate, this coating solution could scatter and contaminate the surface of the substrate.

It is therefore necessary in an actual operation of the treatment to detach and clean the upper spinning plate at appropriate intervals of time before the above inconveniences are encountered. Not only are the detachment, cleaning and reassembly irksome, but the discontinuation of the treatment results in a reduction in the treating efficiency as a whole.

SUMMARY OF THE INVENTION

The present invention has been made having regard to the state of the art noted above, and has for an object to provide a spin coating apparatus which allows the upper spinning plate to be cleaned easily and quickly without necessitating detachment thereof, thereby utilizing the characteristics of this type of apparatus to the full extent to realize an efficient spin coating treatment.

The above object is fulfilled, according to the present invention, by a spin coating apparatus for use in applying a coating solution in film form to an upper surface of a substrate, which comprises;

a spinning table for supporting and spinning the substrate in horizontal posture;

an upper spinning plate disposed parallel to and substantially slightly spaced from the upper surface of the substrate supported on the spinning table, and having an opening formed substantially centrally thereof, the upper spinning plate being adapted to spin concurrently with the spinning table; and a cleaning nozzle having an outlet port disposed in the opening for delivering a cleaning liquid toward a lower surface of the upper spinning plate, to thereby clean the lower surface of the upper spinning plate.

With this construction, after a predetermined number of spin coating treatments, the upper spinning plate is driven to spin with the spinning table while at the same time a cleaning liquid is supplied to the cleaning nozzle. The cleaning liquid is directed from the outlet port of the cleaning nozzle to the lower surface of the upper spinning plate. Then, the cleaning liquid flows radially outward along the lower surface of the rotary plate under the centrifugal force, to wash off the coating solution having adhered to the lower surface during the preceding spin coating treatments.

According to the present invention, therefore, the lower surface of the upper spinning plate is cleaned easily and quickly without detaching the upper spinning plate. This enables an efficient coating treatment to form a film of uniform thickness free from contamination.

BRIEF DESCRIPTION OF THE DRAWINGS

For the purpose of illustrating the invention, there is shown in the drawings a form which is presently preferred, it being understood, however, that the invention is not limited to the precise arrangements and instrumentalities shown.

DETAILED DESCRIPTION OF THE PREFERRED EMBODIMENT

A preferred embodiment of the present invention will be described in detail hereinafter with reference to the drawings.

Figure 1:
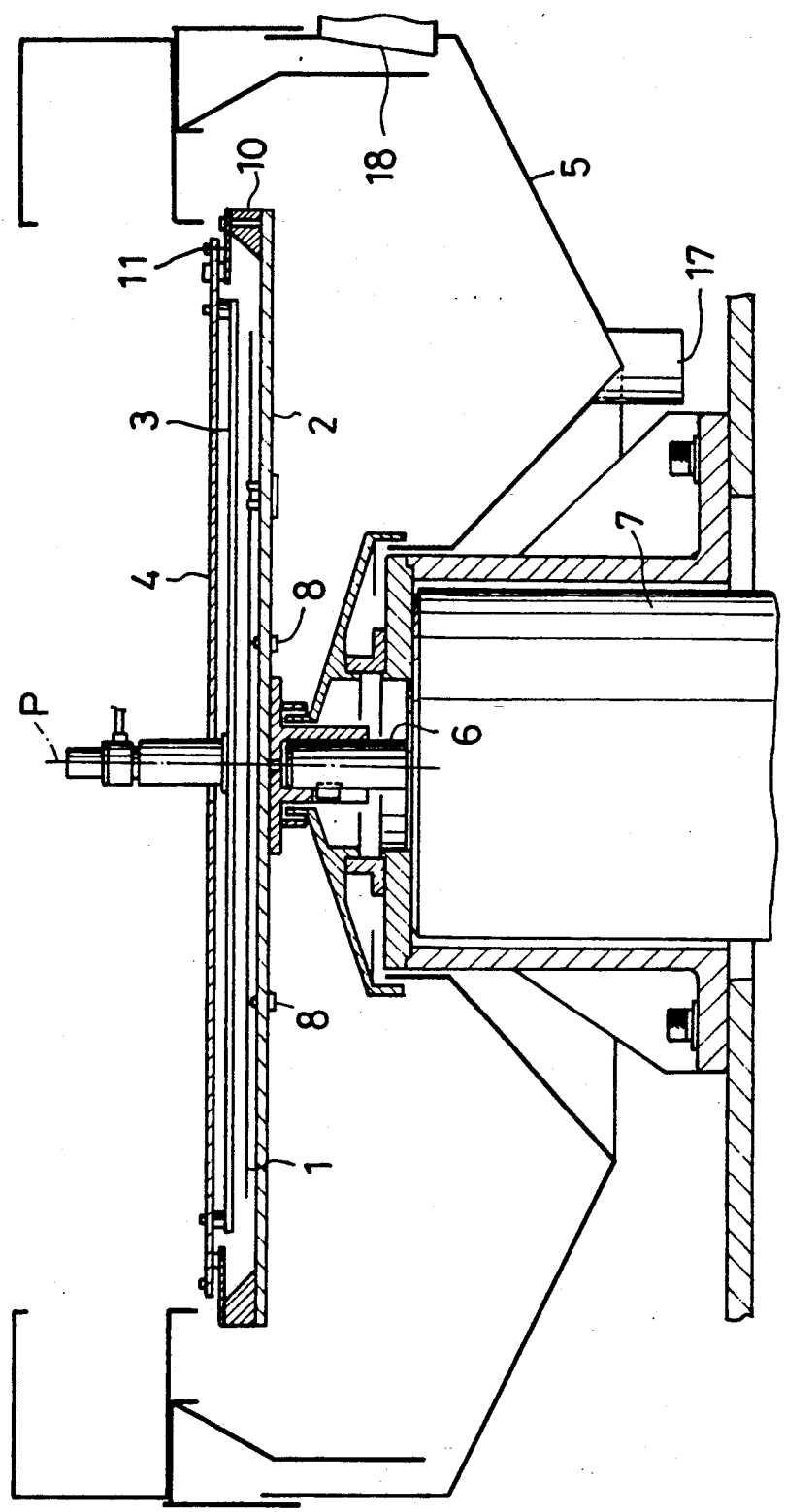
FIG. 1 is a view in vertical section of an entire spin coating apparatus according to the present invention.

FIG. 1 is a view in vertical section schematically showing an outline of an entire spin coating apparatus embodying the present invention.

This spin coating apparatus comprises a spinning table 2 rotatable horizontally about a vertical axis P with a square substrate 1 supported thereon, an upper spinning plate 3 parallel to and rotatable with the spinning table 2, an upper support plate 4 for supporting the upper spinning plate 3, a waste liquid collecting case 5 surrounding lower and peripheral regions of these spinning components, and a motor 7 having a vertical rotary shaft or output shaft 6.

Figure 2:
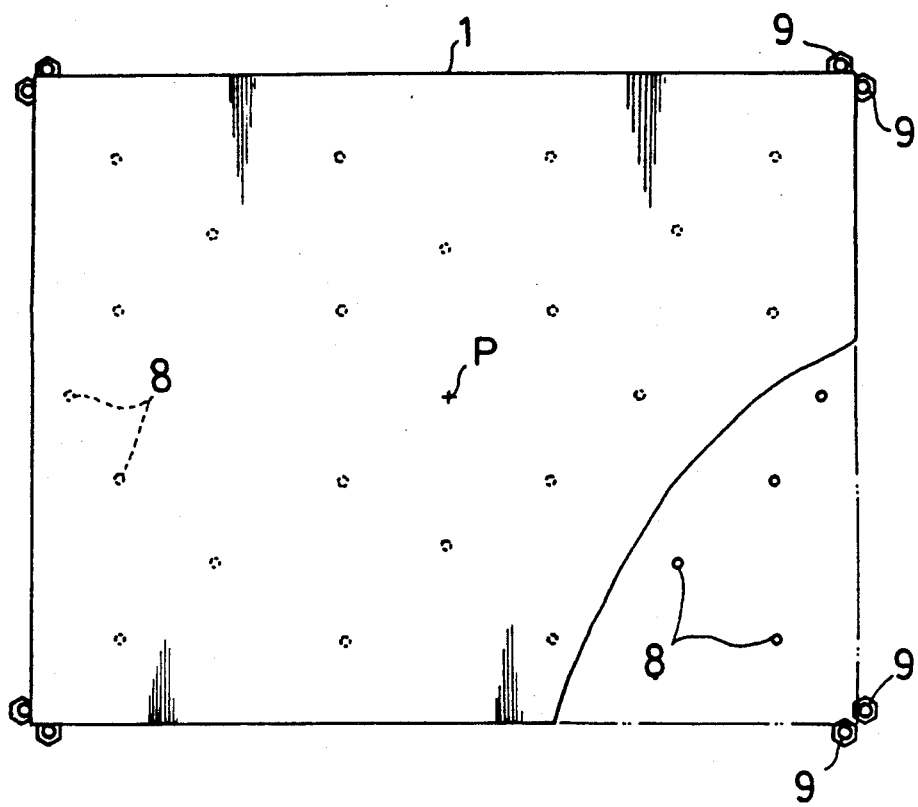
FIG. 2 is a plan view showing a way in which a substrate is mounted on a spinning table.

The spinning table 2 is in the form of a disk having a size well in excess of an outline contour of the substrate 1. The substrate 1 is supported in horizontal posture on a plurality of substrate supporting pins 8 erected on an upper surface of the spinning table 2. As shown in FIG. 2, the spinning table 2 further includes four pairs of engaging pins 9, one pair engaging each of the four corners of the substrate 1. These engaging pins 9 cause the substrate 1 to spin horizontally with the spinning table 2.

Figure 3:
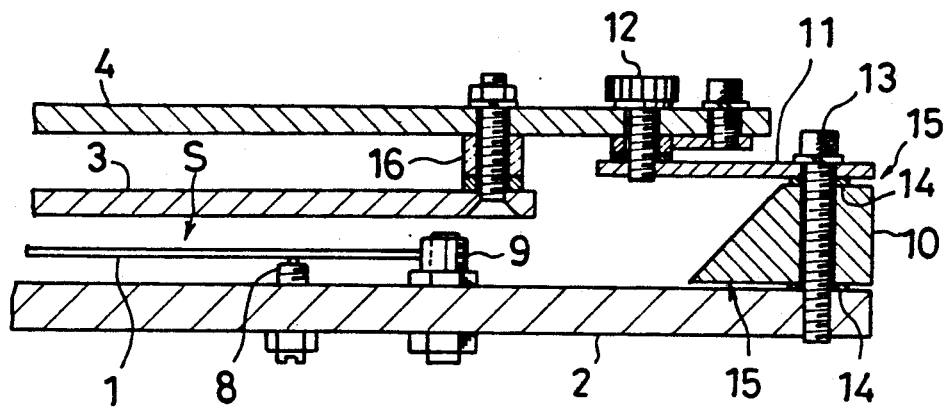
FIG. 3 is an enlarged view in vertical section of a peripheral portion of the spinning table.

As shown in FIG. 3, the spinning table 2 carries a spacer ring 10 and a ring plate 11, both having the same outside diameter as the spinning table 2 and connected to a plurality of peripheral positions on a concentric circle of the spinning table 2. The upper support plate 4 is detachably attached to the ring plate 11 by knob bolts 12. With the upper support plate 4 detached, the substrate 1 may be transported in and out through the center opening of the ring plate 11.

The spacer ring 10 has a trapezoidal section, and defines upper and lower gaps 15 for allowing outflow of waste liquid. These gaps 15 correspond to a thickness of upper and lower washers 14 fitted on connecting bolts 13.

The upper spinning plate 3 is in the form of a disk having a diameter greater than the outline contour of the substrate 1, and is bolted to a bottom surface of the upper support plate 4 through collars 16.

The waste liquid collecting case 5 has a tapered bottom defining a liquid drain 17 at a lower end thereof. Further, the case 5 includes a plurality of exhaust openings 18 peripherally thereof for releasing a solvent gas evaporating from a coating solution and mist of the coating solution.

The spin coating apparatus basically is constructed as above. In carrying out a coating treatment, the upper support plate 4 is removed first, and the substrate 1 is set in a predetermined posture on the substrate supporting pins 8 of the spinning table 2.

Next, a coating solution supplying nozzle not shown is moved to a position centrally and upwardly of the substrate 1, and the coating solution is dripped in a predetermined quantity. Subsequently, the upper support plate 4 is fixed to the ring plate 11, and the motor 7 is started to spin the spinning table 2, upper support plate 4, upper spinning plate 3 and substrate 1 all together horizontally. With this spin, the coating solution is spread outwardly over the substrate 1 by the centrifugal force thereby generated, to be coated thin on the upper surface of the substrate 1. At this time, a layer of air in a flat coating treatment space S formed between the spinning table 2 and upper spinning plate 3 spins therewith. Consequently, the coating solution is spread over the substrate 1 with no air flow occurring.

Superfluous part of the coating solution reaching outer peripheries of the substrate 1 flows off the peripheries to scatter from all peripheral regions of the coating treatment space S. The scattering coating solution passes through the gaps 15 defined over and under the spacer ring 10, to be collected in the waste liquid collecting case 5.

The spin coating apparatus in this embodiment includes a mechanism for cleaning the lower surface of the upper spinning plate 3 by washing off the coating solution adhering thereto. This mechanism will be described hereinafter with reference to FIGS. 4 and 5.

The upper spinning plate 3 defines an opening 20 centrally thereof, and has a nozzle supporting housing 21 fixedly erected thereon and connected to the opening 20. This housing 21 has a tubular configuration for accommodating a cleaning nozzle 23 mounted centrally thereof to be vertically slidable through a slide bearing 22 and upwardly urged by a compression coil spring 24.

The cleaning nozzle 23 has a flange-like large diameter portion 23a formed at a lower end thereof. The large diameter portion 23a is movable into contact with a recess 25 formed in a lower end of the housing 21 to define an upper limit to the vertical slide of the cleaning nozzle 23. When the cleaning nozzle 23 is in an upper limit position, a lower surface of the large diameter portion 23a is substantially flush with the lower surface of the upper spinning plate 3. The cleaning nozzle 23 further defines a cleaning liquid supply passage 26 extending axially thereof, and an outlet port 27 communicating with a lower end of the cleaning liquid supply passage 26. The outlet port 27 is defined in a peripheral position directly above the large diameter portion 23a, with an inclination angle slightly turned up outwardly.

The housing 21 has a cylinder bracket 29 mounted in an upper end region thereof to be adapted to spin through a bearing 28. An air cylinder 30 is mounted on an upper surface of the bracket 29, with a piston rod 30a extending downward. The piston rod 30a is connected at an extreme end thereof to a coupling 31 connected by piping to a cleaning liquid feed mechanism not shown. The coupling 31 defines therein a flow passage 32 opposed to an upper end of the cleaning liquid supply passage 26. The flow passage 32 is placed in communication with the liquid supply passage 26 when the piston rod 30a is extended.

The way this cleaning mechanism operates will be described next.

Figure 4:
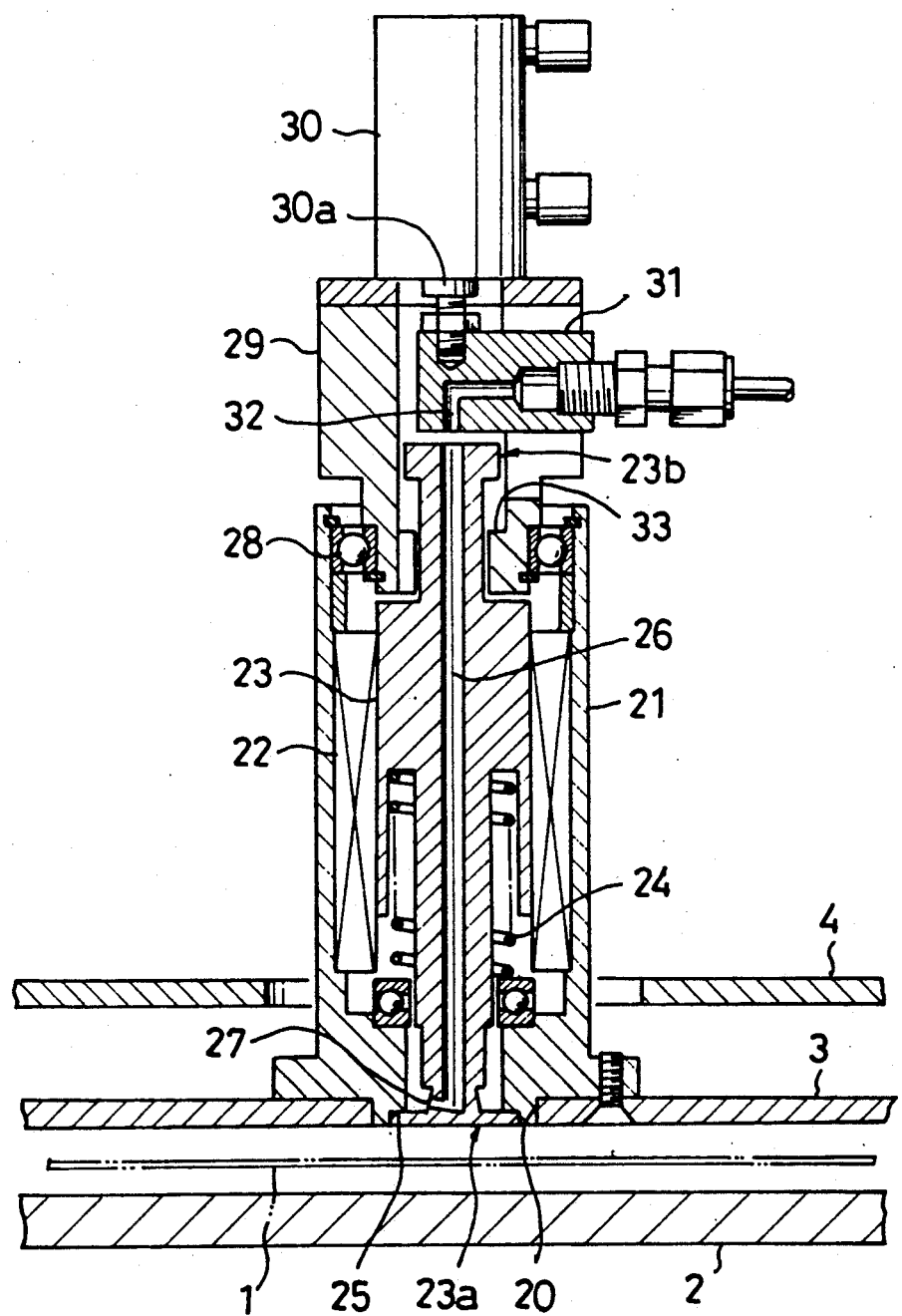
FIG. 4 is a view in vertical section of a plate cleaning mechanism during a spin coating treatment.

During a spin coating treatment for treating the substrate 1, as shown in FIG. 4, the cleaning nozzle 23 is raised to the upper limit by action of the compression coil spring 24, with the outlet port 27 contained in the housing 21. In this state, the large diameter portion 23a at the lower end of the cleaning nozzle 23 is fitted in and contacts the recess 25 at the lower surface of the housing 21. Thus, when the housing 21 spins with the upper spinning plate 3, the cleaning nozzle 23 also spins with the rotary plate 3 through the frictional contact at the large diameter portion 23a. Undulations may be formed on a flanged upper surface of the large diameter portion 23a and a lower surface of the recess 25 for mutual engagement. This will spin the cleaning nozzle 23 more positively than reliance on the mere frictional contact.

Figure 5:
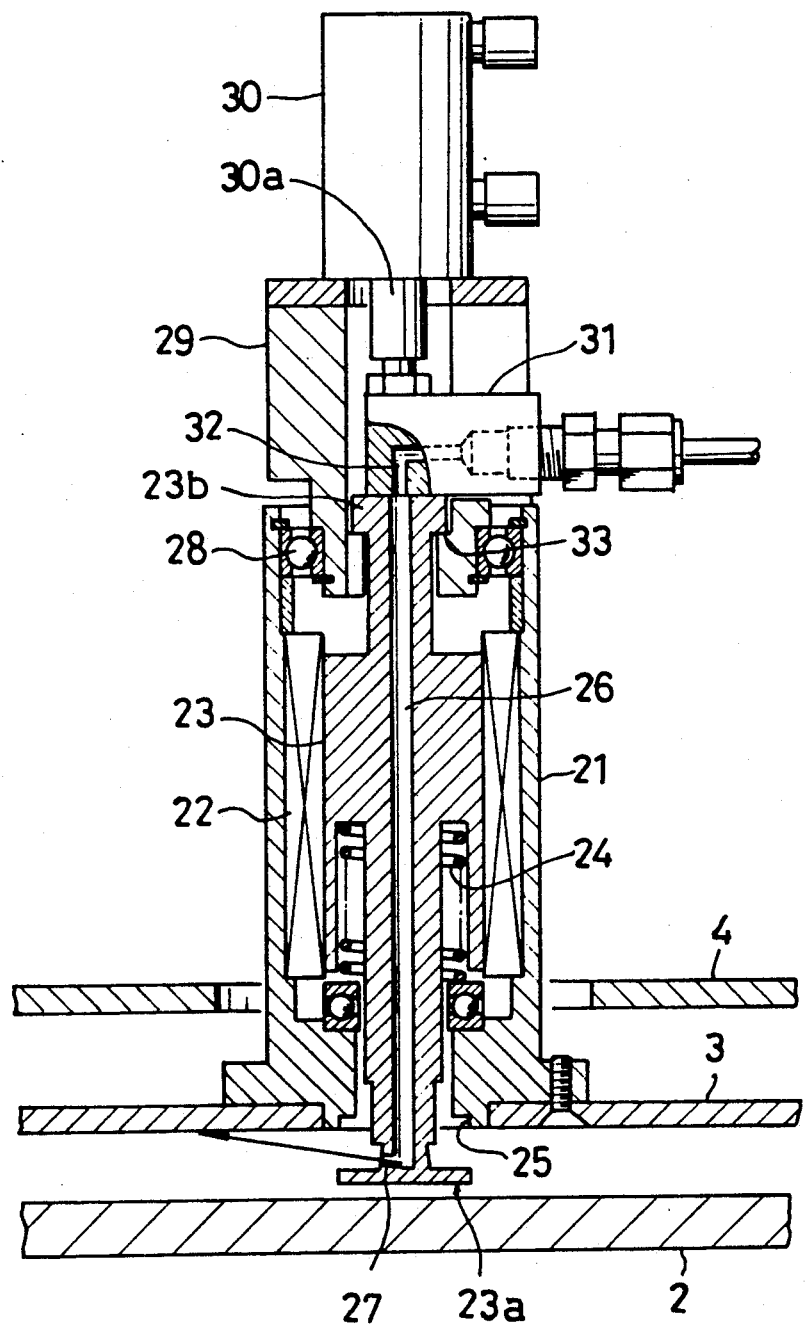
FIG. 5 is a view in vertical section of the plate cleaning mechanism during a cleaning treatment.

The lower surface of the upper spinning plate 3 is cleaned after a predetermined number of spin coating treatments. For this purpose, as shown in FIG. 5, the piston rod 30a of the air cylinder 30 is extended to press the coupling 31 on the upper end of the cleaning nozzle 23. In this way, the cleaning nozzle 23 is lowered against the force of compression coil spring 24 until an upper large diameter portion 23b of the cleaning nozzle 23 contacts a descent limiting shoulder 33 formed in the cylinder bracket 29. As a result, the flow passage 32 of the coupling 31 communicates with the cleaning liquid supply passage 26, and the outlet port 27 at the lower end of the cleaning nozzle 23 is exposed below the upper spinning plate 3. It is now ready to spray a cleaning liquid to the lower surface of the upper spinning plate 3.

In this state, the large diameter portion 23a of the cleaning nozzle 23 is separated from the recess 25 of the housing 21, while the upper large diameter portion 23b is in contact with the shoulder 33 of the cylinder bracket 29 which is a stationary element. Thus, the cleaning nozzle 23 may be fixed against the spin of the upper spinning plate 3. That is, the lower surface of the upper spinning plate 3 in a spin is cleaned by spraying the cleaning liquid thereto through the outlet port 27 of the cleaning nozzle 23 standing still.

To achieve a uniform film thickness, the lower surface of the cleaning nozzle 23 is preferably flush with the lower surface of the upper spinning plate 3 when the nozzle 23 is raised during a spin coating treatment. However, the lower surface of the nozzle 23 may, without posing any practical problem, project from the lower surface of the rotary plate 3 to an extent not exceeding 2 mm.

It is preferable that the cleaning nozzle 23 rotates with the upper spinning plate 3 during a spin coating treatment. However, since the lower surface of the cleaning nozzle 23 has only a small area, the nozzle 23 maintained stationary during the coating treatment will hardly disturb the layer of air over the substrate 1.

Further, the space between the substrate 1 and upper spinning plate 3 is decompressed during the spin coating treatment. It is therefore desirable to maintain gastightness around the nozzle 23 in order to prevent ambient gas from flowing in over the substrate 1 through gaps between the cleaning nozzle 23 and housing 21.

The present invention may be embodied in other specific forms without departing from the spirit or essential attributes thereof and, accordingly, reference should be made to the appended claims, rather than to the foregoing specification, as indicating the scope of the invention.

What is claimed is:

1. A spin coating apparatus for use in applying a coating solution in film form to an upper surface of a substrate, said apparatus comprising:

a spinning table for supporting and spinning said substrate in horizontal posture;

an upper spinning plate disposed parallel to and substantially slightly spaced from the upper surface of said substrate supported on said spinning table, and having an opening formed substantially centrally thereof, said upper spinning plate being adapted to spin concurrently with said spinning table; and a cleaning nozzle having an outlet port disposed in said opening and faced toward a lower surface of said upper spinning plate, to deliver a cleaning liquid toward said lower surface of said upper deliver a cleaning liquid toward said lower surface of said upper spinning plate for cleaning said lower surface.

2. A spin coating apparatus as claimed in claim 1, wherein said cleaning nozzle has a tube portion and a flange-like large diameter portion formed on a lower end of said tube portion and having a larger diameter than that of said tube portion, said outlet port being formed on said tube portion for delivering the cleaning liquid outwardly.

3. A spin coating apparatus as claimed in claim 1, wherein said cleaning nozzle is vertically slidably mounted in a housing fixedly erected on said upper spinning plate and connected to said opening, said housing surrounding said opening in a gastight condition with said cleaning nozzle mounted inside.

4. A spin coating apparatus as claimed in claim 3, wherein said cleaning nozzle is biased upward within said housing, and said apparatus further comprising drive means for pushing down said cleaning nozzle while delivering said cleaning liquid toward the lower surface of said upper spinning plate.

5. A spin coating apparatus as claimed in claim 3, wherein said large diameter portion at the lower end of said cleaning nozzle is movable into contact with a recess formed in a lower end of said housing to determine an upper limit to movement of said cleaning nozzle when coating the coating solution to said substrate, said large diameter portion having a lower surface substantially flush with the lower surface of said upper spinning plate when said cleaning nozzle has moved to said upper limit.

6. A spin coating apparatus as claimed in claim 5, wherein said large diameter portion of said cleaning nozzle is adapted to engage with said recess of said housing while said cleaning nozzle is located at said upper limit, so that said cleaning nozzle is capable of spinning integrally with said upper spinning plate.

7. A spin coating apparatus as claimed in claim 5, wherein a lower end of said cleaning nozzle is disengaged from said upper spinning plate, and said cleaning nozzle is standing still as isolated from spinning of said upper spinning plate, while delivering said cleaning liquid toward the lower surface of said upper spinning plate.

* * * * *